(12) United States Patent
Lauxtermann

(10) Patent No.: US 7,923,763 B2
(45) Date of Patent: Apr. 12, 2011

(54) TWO-DIMENSIONAL TIME DELAY INTEGRATION VISIBLE CMOS IMAGE SENSOR

(75) Inventor: Stefan C. Lauxtermann, Camarillo, CA (US)

(73) Assignee: Teledyne Licensing, LLC, Thousand Oaks, CA (US)

(*) Notice: Subject to any disclaimer, the term of this patent is extended or adjusted under 35 U.S.C. 154(b) by 675 days.

(21) Appl. No.: 11/683,811

(22) Filed: Mar. 8, 2007

(65) Prior Publication Data

US 2008/0217661 A1 Sep. 11, 2008

(51) Int. Cl.
*H01L 31/062* (2006.01)

(52) U.S. Cl. .......... 257/292; 257/E27.132; 257/E27.133

(58) Field of Classification Search ........... 257/E27.132, 257/E27.133, 292; 348/295
See application file for complete search history.

(56) References Cited

U.S. PATENT DOCUMENTS

| | | | |
|---|---|---|---|
| 4,956,716 A | 9/1990 | Hewitt et al. | |
| 5,303,027 A | 4/1994 | Kuderer et al. | |
| 5,471,515 A | 11/1995 | Fossum et al. | |
| 5,847,594 A | 12/1998 | Mizuno | |
| 6,011,251 A | 1/2000 | Dierickx et al. | |
| 6,121,843 A | 9/2000 | Vampola et al. | |
| 6,157,170 A | 12/2000 | Noda et al. | |
| 6,239,456 B1 * | 5/2001 | Berezin et al. | 257/232 |
| 6,300,613 B1 | 10/2001 | Kuderer | |
| 6,326,603 B1 | 12/2001 | Kuderer | |
| 6,455,837 B2 | 9/2002 | Mizuno | |
| 6,486,504 B1 | 11/2002 | Guidash | |
| 6,642,496 B1 | 11/2003 | Gulbransen | |
| 6,642,503 B2 | 11/2003 | Kummaraguntla et al. | |
| 6,664,777 B2 | 12/2003 | Hyakutake et al. | |
| 6,678,039 B2 | 1/2004 | Charbon | |
| 6,713,796 B1 | 3/2004 | Fox | |
| 6,885,047 B2 | 4/2005 | Shinohara et al. | |
| 6,919,549 B2 | 7/2005 | Bamji et al. | |
| 6,977,601 B1 | 12/2005 | Fletcher et al. | |
| 6,977,682 B2 | 12/2005 | Mizuno et al. | |
| 7,115,925 B2 | 10/2006 | Rhodes | |
| 7,138,287 B2 | 11/2006 | Mouli et al. | |
| 7,157,685 B2 | 1/2007 | Bamji et al. | |
| 7,202,463 B1 | 4/2007 | Cox | |
| 7,244,919 B2 | 7/2007 | Ishikawa et al. | |
| 7,326,903 B2 | 2/2008 | Ackland et al. | |
| 7,388,413 B1 | 6/2008 | Ball | |
| 7,453,131 B2 | 11/2008 | Marshall et al. | |
| 2003/0213984 A1 * | 11/2003 | Berezin et al. | 257/232 |
| 2005/0092894 A1 * | 5/2005 | Fossum | 250/208.1 |
| 2005/0167709 A1 | 8/2005 | Augusto | |
| 2006/0181627 A1 | 8/2006 | Farrier | |
| 2007/0194356 A1 | 8/2007 | Moon et al. | |

OTHER PUBLICATIONS

"CMOS Minimal Array", Janesick et al., *Proceedings of the SPIE*, Vole. 6295, 62950), 15 pages, 2006.

(Continued)

*Primary Examiner* — Jerome Jackson, Jr.
*Assistant Examiner* — Paul A Budd
(74) *Attorney, Agent, or Firm* — Snell & Wilmer L.L.P.

(57) ABSTRACT

A two dimensional time delay integration CMOS image sensor having a plurality of pinned photodiodes, each pinned photodiode collects a charge when light strikes the pinned photodiode, a plurality of electrodes separating the plurality of pinned photodiodes, the plurality of electrodes are configured for two dimensional charge transport between two adjacent pinned photodiodes, and a plurality of readout nodes connected to the plurality of pinned photodiodes via address lines.

14 Claims, 7 Drawing Sheets

OTHER PUBLICATIONS

"Fabrication and Initial Results for a Back-Illuminated Monolithic APS in a Mixed SOI/Bulk CMOS Technology", Bedabrata Pain, Jun. 2005 IEEE Workshop, pp. 102-104, Jun. 2005.

"Design of High-Performance Microprocessor Circuits", Chandrakasan et al., *IEEE Press*, pp. 285-308, 2001.

"Back-Gate Controlled READ SRAM with Improved Stability", Jae-Joon Kim, et al., *IEEE International SOI Confernece*, pp. 211-212, 2005.

"An SOI 4 Transistors Self-Refresh Ultra-Low-Voltage Memory Cell", Oliver Thomas, *ISCAS*, pp. V-401-V-404, May 2003.

"3-D ICs: A Novel Chip Design for Improving Deep-Submicrometer Interconnect Performance and Systems-on-Chip Integration," Banerjee et al., *Proceedings of the IEEE*, vol. 89, N. 5, pp. 602-633, May 2001.

"A 0.18μm CMOS 1000 frames/sec, 138dB Dynamic Range Readout Circuit for 3D-IC Focal Plane Arrays", Kavusi et al., Department of Electrical Engineering, Stanford University, 4 pages.

"Chip-to-Chip Interconnections Based on the Wireless Capacitive Coupling for 3D Integration", Charlet et al., *Microelectronic Engineering 83*, pp. 2195-2199, 2006.

"CMOS Image Sensors", Gamal et al., *IEEE Circuits & Devices Magazine*, pp. 6-20, May/Jun. 2005.

"CMOS Image Sensors: Electronic Camera-On-A-Chip", Eric R. Fossum, *IEEE Transactions on Electron Devices*, vol. 44, No. 10, pp. 1689-1698, Oct. 1997.

"A Computational Image Sensor with Adaptive Pixel-Based Integration Time", Hamamoto et al., *IEEE Journal of Solid-State Circuits*, vol. 36, No. 4, pp. 580-585, Apr. 2001.

"Development of a Production-Ready, Black-Illuminated CMOS Image Sensor with Small Pixels", Joy et al., IEEE, pp. 1007-1010, 2007.

"Folded Multiple-Capture: An Architecture for High Dynamic Range Disturbance-Tolerant Focal Plane Array", Kavusi et al., *Proc. Of SPIE*, vol. 5406, pp. 351-360, 2004.

"High Density Vertical Interconnects for 3-D Integration of Silicon Integrated Circuits", Bower et al., *2006 Electronic Components and Technology Conference*, pp. 399-403, 2006.

"In-Pixel Autoexposure CMOS APS," Yadid-Pecht et al., *IEEE Journal of Solid-State Circuits*, vol. 38, No. 8, pp. 1425-1428, Aug. 2003.

"Intelligent Image Sensor Chip with Three Dimensional Structure", Kurino et al., *IEDM*, pp. 879-882, 1999.

"Neuromorphic Vision Chip Fabricated Using Three-Dimensional Integration Technology", Koyanagi et al., *IEEE International Solid-State Circuits Conference*, 3 pages, Feb. 7, 2001.

"Proximity Communication", Drost et al., *IEEE Journal of Solid-State Circuits*, vol. 39, No. 9, pp. 1529-1535.

"Quantitative Study of High Dynamic Range Image Sensor Architectures", Kavusi, et al., *SPIE-IS&T*, vol. 5301, pp. 264-275, 2004.

"Synthesis of high Dynamic Range Motion Blur Free Image From Multiple Captures", *IEEE Transactions on Circuits and Systems- I: Fundamental Theory and Applications*, vol. 50, No. 4, pp. 530-539, Apr. 2003.

"Vertically-Integrated Sensor Arrays-VISA", Horn et al., *Proc. of SPIE*, vol. 5406, pp. 332-340, 2004.

"Wide-Dynamic-Range Sensors", Yadid-Pecht et al., *Optical Engineering*, vol. 38, No. 10, pp. 1650-1660, Oct. 1999.

"Wide Intrascene Dynamic Range CMOS APS Using Dual Sampling", Yadid-Pecht, *IEEE Transactions on Electron Devices*, vol. 44, No. 10, pp. 1721-1723, Oct. 1997.

"A Wafer-Scale 3-D Circuit Integration Technology", Burns et al., *IEEE Transactions on Electron Devices*, vol. 53, No. 10, pp. 2507-2516, Oct. 2006.

"PVT-Aware Leakage Reduction for On-Die Caches with Improved Read Stability", Kim et al., 2005 IEEE International Solid State Circuits Conference, pp. 13-15, Feb. 9, 2005.

Davis, Rhett W. et al; "Demystifying 3D ICs: The Pros and Cons of Going Vertical" IEEE Design & Test of Computers; pp. 498-510; 2005.

* cited by examiner

US 7,923,763 B2

TWO-DIMENSIONAL TIME DELAY INTEGRATION VISIBLE CMOS IMAGE SENSOR

BACKGROUND OF THE INVENTION

1. Field of the Invention

The invention relates generally to a Complementary Metal Oxide Semiconductor (CMOS) image sensor. More particularly, the invention relates to two-dimensional time delay integration visible CMOS image sensor.

2. Description of Related Art

Unmanned Aerial Vehicles (UAVs) are remotely piloted or self-piloted aircrafts that can carry cameras, sensors, and other communication equipment. UAVs may be remotely controlled (e.g. flown by a pilot at a ground control station) or fly autonomously based on pre-programmed flight plans or more complex dynamic automation systems. UAVs are typically used for reconnaissance and intelligence-gathering, and for more challenging roles, including combat missions.

Ideally, an image taken from a camera onboard the UAV should be clear to provide accurate intelligence-gathering and determine appropriate targets. However, since UAVs shake from wind gusts during their flight operation, the image received from UAV is not clear enough to accurately identify targets on the ground. Consequently, there is a low signal to noise ratio due to wind and mechanical vibrations of the camera. This problem is compounded with moving scene imagery.

To improve signal to noise ratio, prior art stabilizers were integrated with the gimbal assembly of high speed cameras onboard the UAVs. The stabilizers reduce interferences caused by wind or mechanical vibrations. Additionally, the signal to noise ratio may be improved using Charge-Coupled Devices (CCDs) with Time Delay Integration (TDI). CCDs with TDI technology allow an image in a charge domain to move at about the same speed as the moving scene or target. However, CCDs with TDI are one dimensional and require multiple chip systems.

Conventional CMOS integrated circuits can achieve TDI in one dimension. The CMOS integrated circuits provide TDI using a switch matrix or a transistor chain CCD equivalent. The switch matrix typically accumulates additional noise and the signal to noise ratio improvement is less than proportional to the square root of the number of TDI channels. The transistor chain CCD equivalent cannot have high QE photodiode and is not a mainstream CMOS or CMOS Image Sensor (CIS) process.

With an ever increasing demand for improved imaging sensors, there remains a need for a two dimensional TDI visible CMOS image sensor that allow a charge to move at the same speed and follow a similar path in the charge domain as the moving image so that more charge from the scene can be integrated resulting in an improved signal to noise ratio. If readout noise is dominant, the signal to noise ratio improvement is proportional to the number of TDI channels.

SUMMARY OF THE INVENTION

The present invention fills this need by providing a time delay integration CMOS image sensor having a first pinned photodiode and a second pinned photodiode, the first pinned photodiode collects a charge when light strikes the first pinned photodiode, the second pinned photodiode receives the charge from the first pinned photodiode, and a plurality of electrodes in series located between the first and the second pinned photodiodes, the plurality of electrodes are configured to transfer the charge from the first pinned photodiode to the second pinned photodiode. The plurality of electrodes may be activated consecutively at different cycles.

In one embodiment, the time delay integration CMOS image sensor may include a plurality of readout nodes coupled to the second pinned photodiode via address lines. The number of readout nodes may be equal to the number of pinned photodiodes. The plurality of electrodes, the plurality of readout nodes and the address lines may form an orthogonal or hexagonal grid around the perimeter of each pinned photodiode.

BRIEF DESCRIPTION OF THE DRAWINGS

The exact nature of this invention, as well as the objects and advantages thereof, will become readily apparent from consideration of the following specification in conjunction with the accompanying drawings in which like reference numerals designate like parts throughout the figures thereof and wherein.

DETAILED DESCRIPTION OF THE PREFERRED EMBODIMENTS

Photodiodes are widely used in digital imaging devices to convert optical signals into electrical signals. Photodiodes may be arranged in linear or planar arrays with a plurality of photosensitive sensors, generally designated as pixels, on a semiconductor chip. Each pixel generates an output signal representing the amount of light incident on the pixel.

Figure 1:
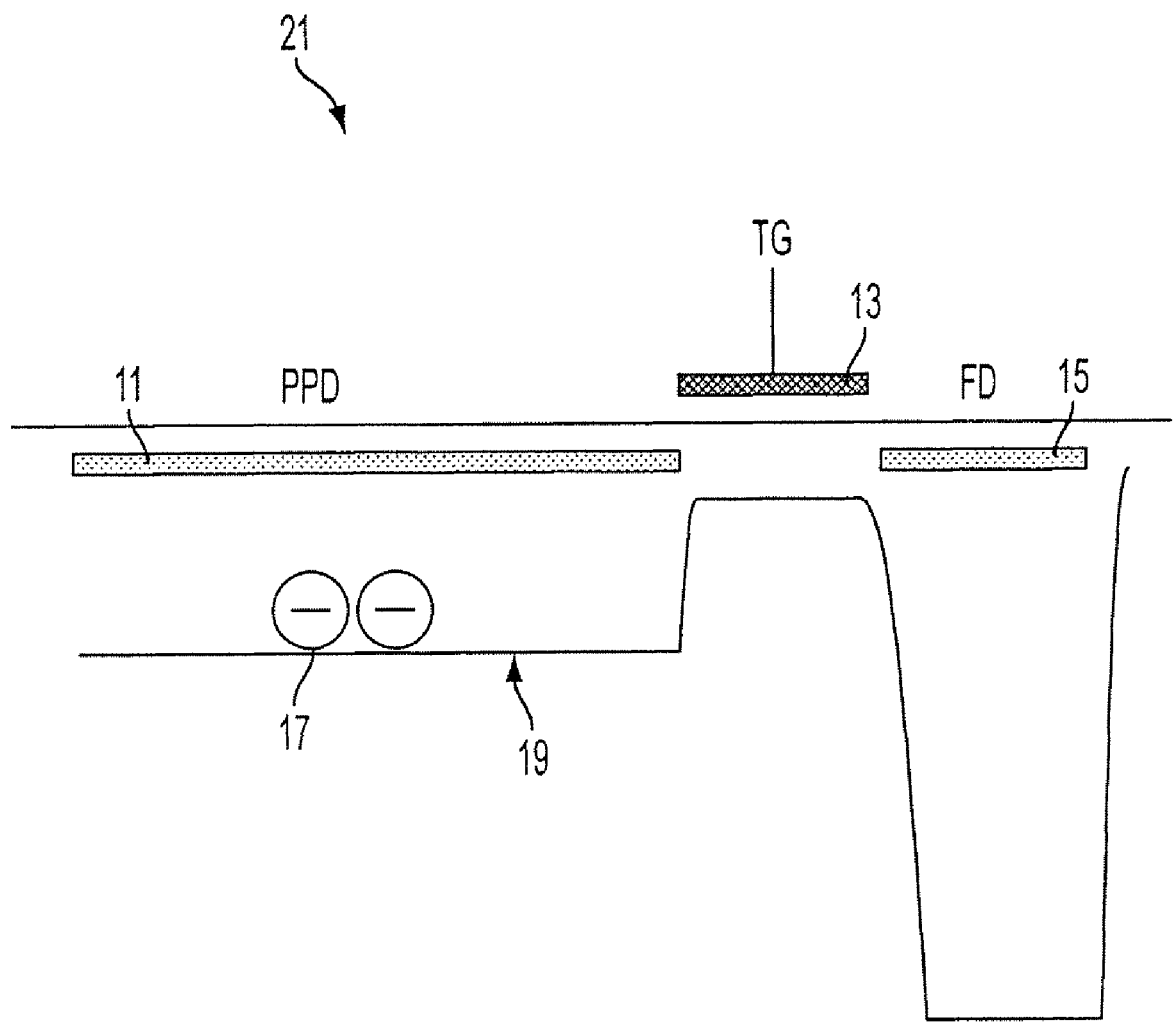
FIG. 1 is a prior art pinned photodiode with transfer gate and floating diffusion.

A pinned photodiode (PPD) is used to produce and integrate photoelectric charges generated in CCD or CMOS image sensors. FIG. 1 is a prior art pinned photodiode 11 with transfer gate 13 and floating diffusion 15. The pinned photodiode 11 generates a charge 17 while maintaining a fixed or pinned Fermi level 19. Regardless of the potential next to the Fermi level 19 of the pinned photodiode 11, the Fermi level 19 of the pinned photodiode 11 does not change.

Figure 2:
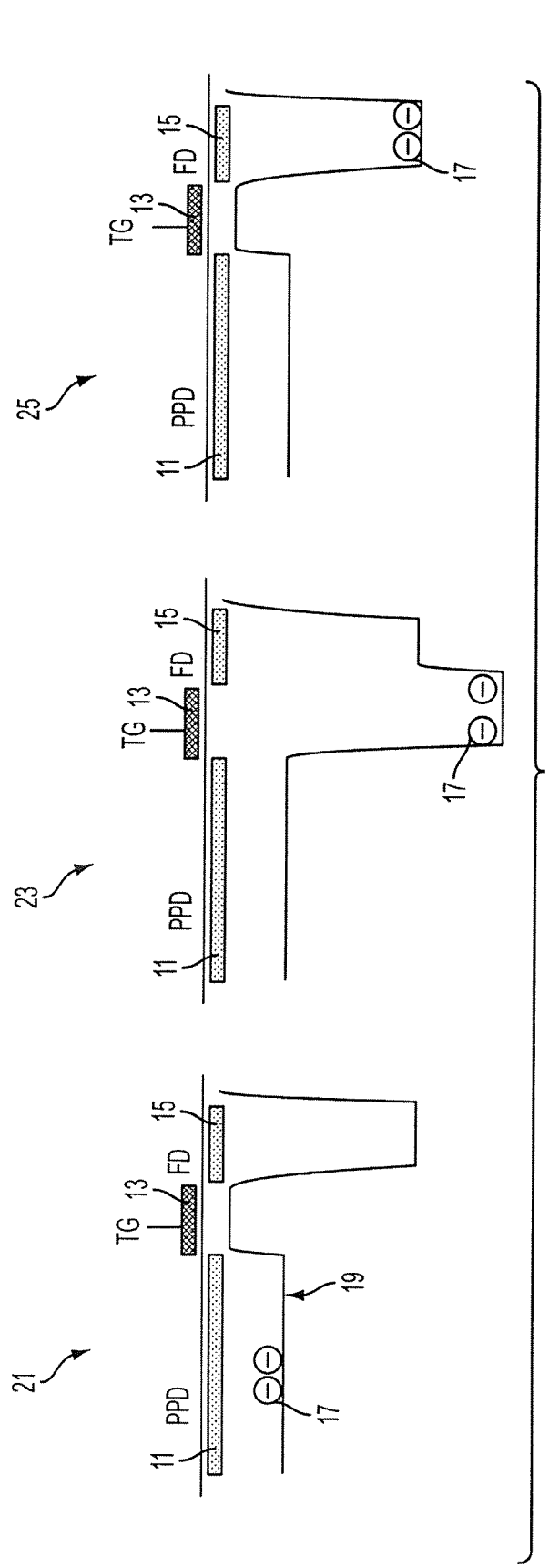
FIG. 2 illustrates the charge transport from the prior art pinned photodiode to the floating diffusion.
Figure 3:
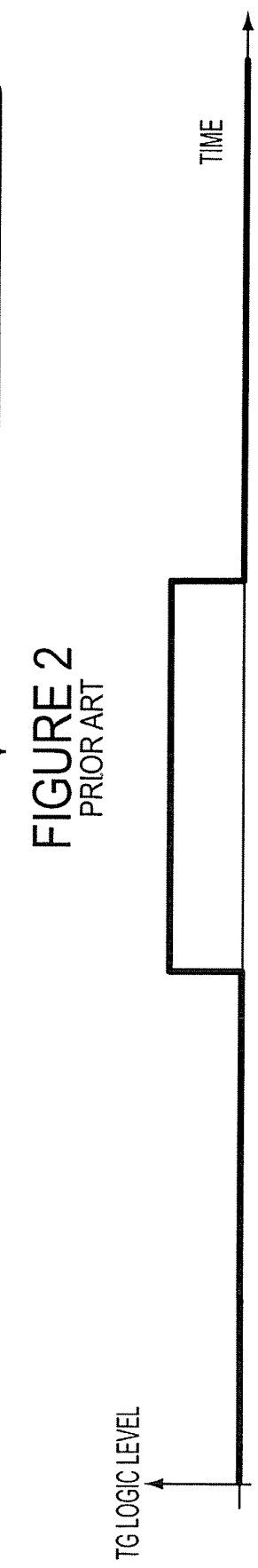
FIG. 3 is a timing diagram of the logic level for the transfer gate in FIG. 2.

Using the pinned photodiode 11 with transfer gate 13 allows for complete charge removal from light sensing area to the floating diffusion 15. FIG. 2 illustrates the charge transport from the pinned photodiode 11 to the floating diffusion 15. FIG. 3 is a corresponding timing diagram of the logic level for the transfer gate 13. In the first state 21, the charge 17 is collected by the pinned photodiode 11. The voltage on transfer gate 13 is zero in the first state 21. Next, in the second state 23, a positive voltage is applied to the transfer gate 13. This applied voltage attracts the charge 17 to move underneath the transfer gate 13, as shown in FIG. 2. Since the applied voltage decreases the quasi-Fermi level 19 underneath the transfer gate 13, charge 17 cannot move back to the pinned photodiode 11. In the third state 25, the applied voltage on transfer gate 13 is set to zero. Since the floating diffusion 15 has a quasi-Fermi level 19 that is lower than the Fermi level 19 of pinned photodiode 11, the charge 17 will move across to the floating diffusion 15.

Combining two transfer gates or electrodes in series provides charge transport from one pixel to the next. FIGS. 4-8 illustrate charge transport in a CMOS image sensor 27, according to an embodiment of the invention. The CMOS image sensor 27 has two or more electrodes 29 between pinned photodiodes 31. By using two or more electrodes 29, charge 36 can be moved from one pinned photo photodiode 31 to another. Preferably, the charge 36 moves at about the same speed as a moving image scene.

Figure 4:
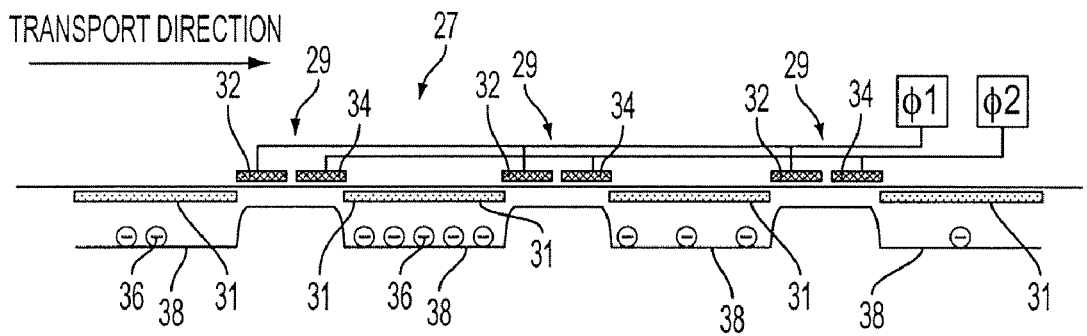
FIGS. 4-8 illustrate charge transport in a CMOS image sensor, according to an embodiment of the invention.
Figure 9:
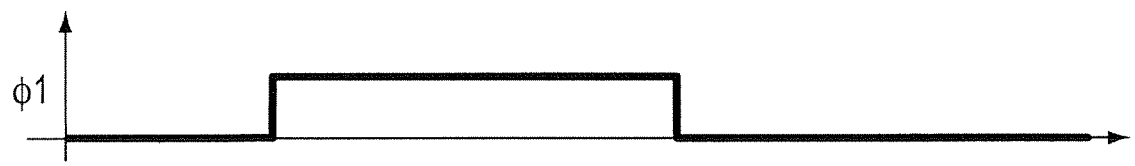
FIG. 9 is a timing diagram of the logic level for the first electrode in FIGS. 4-8.
Figure 10:
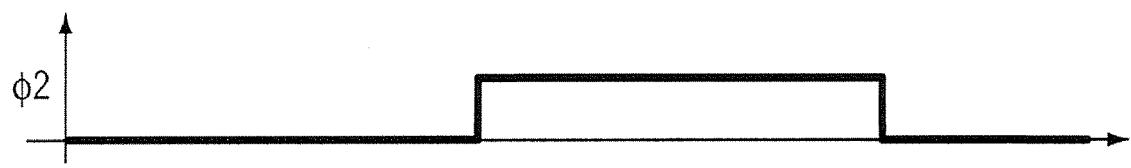
FIG. 10 is a timing diagram of the logic level for the second electrode in FIGS. 4-8.

FIG. 4 shows a first electrode 32 and a second electrode 34 between pinned photodiodes 31. The CMOS image sensor 27 may have a plurality of pinned photodiodes 31 with electrodes 32 and 34 in between. Control logic may be used to operate the first electrode(s) 32 simultaneously. Control logic may also be used to operate the second electrode(s) 34 simultaneously and consecutive to the operation of the first electrode(s) 32. FIGS. 9 and 10 is an exemplary timing diagram of the logic level for the first electrode(s) 32 and second electrode(s) 34, respectively.

In operation, the CMOS image sensor 27 allows charge(s) 36 to travel from one pinned photo photodiode 31 to another. Initially, in FIG. 4, pinned photodiode 31 collects charge(s) 36 while maintaining a fixed or pinned Fermi level 38. Regardless of the potential next to the Fermi level 38 of the pinned photodiode 31, the Fermi level 38 of the pinned photodiode 31 does not change. No voltage is applied to the first and second electrodes 32 and 34.

Figure 5:
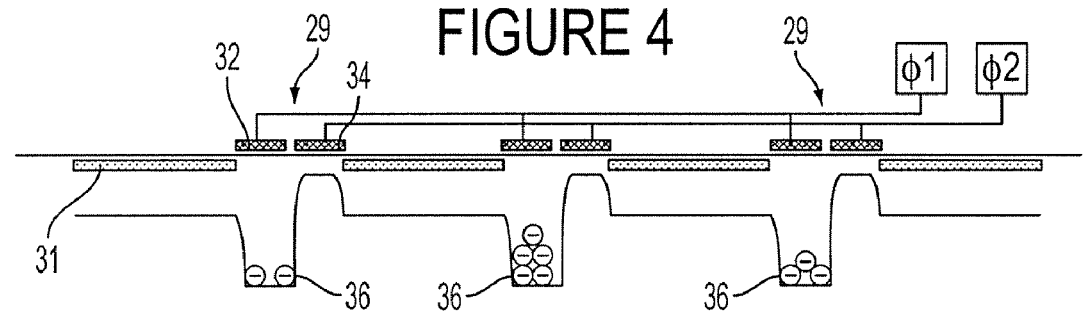

Next, in FIG. 5, the first electrode 32 is activated by applying a voltage for a predetermined period. This voltage attracts the charge 36 to move underneath the first electrode 32. Since the applied voltage decreases the quasi-Fermi level 38 of the first electrode 32 by creating a well, charge 36 cannot move back to the pinned photodiode 31.

Figure 6:
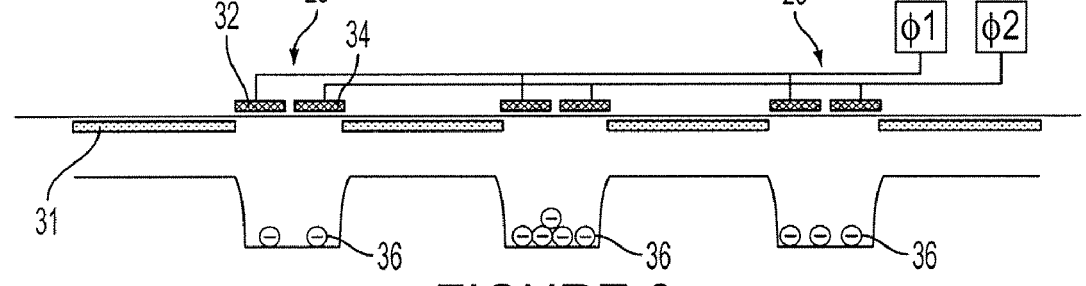

In FIG. 6, the second electrode 34 is activated by applying a positive voltage for a predetermined period. The voltage applied to the second electrode 34 is preferably greater than or equal to the voltage applied to the first electrode 32. The voltage applied to the second electrode 34 attracts the charge 36 to move underneath the second electrode 34 as well. The applied voltage decreases the quasi-Fermi level 38 of the second electrode 34 to allow charge 36 to distribute under both electrodes 32 and 34.

Figure 7:
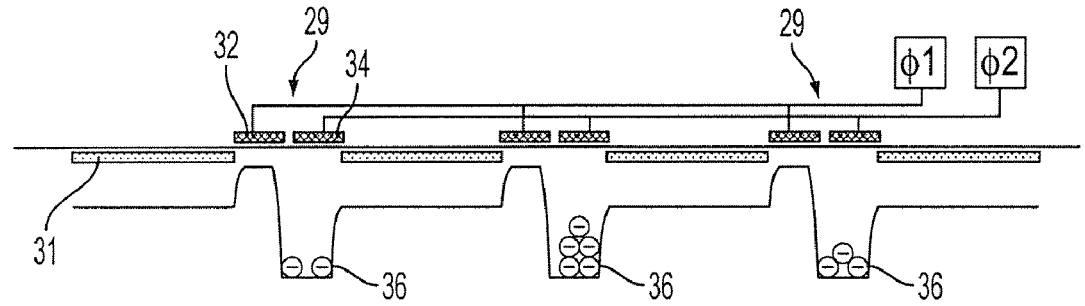

In FIG. 7, the applied voltage for the first electrode 32 is set to zero. This resets the potential of the first electrode 32 and collapses the well underneath the first electrode 32. Since the second electrode 34 is still activated, the quasi-Fermi level 38 of the second electrode 34 will be lower than the quasi-Fermi level 38 underneath first electrode 32 and photodiode 31. Consequently, the charge 36 that was underneath the first electrode 32 will move across and remain underneath the second electrode 34.

Figure 8:
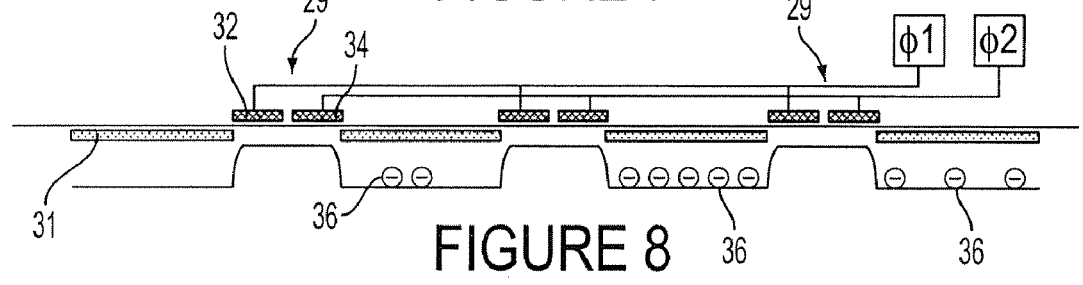

In FIG. 8, the applied voltage for the second electrode 34 is set to zero. This resets the potential of the second electrode 34 and collapses the well underneath the second electrode 34. Since the pinned photodiode 31 has a predetermined fixed Fermi level 31, the charge 36 underneath the second electrode 34 will move across to the adjacent pinned photodiode 31. Consequently, lateral charge 36 transport occurs in the CMOS image sensor 27.

According to an embodiment of the invention, the lateral charge 36 transport occurs over a 4 cycle period, as shown in FIGS. 9 and 10. A person skilled in the art would appreciate that different cycles may be used without departing from the spirit of the invention. In the first cycle, the first electrode 32 is activated by applying a positive voltage. In the second cycle, the second electrode 34 is activated as well by applying a voltage. In the third cycle, the first electrode 32 is deactivated by setting the voltage applied to the first electrode 32 to zero. In the fourth cycle, the second electrode 34 is deactivated by setting the voltage applied to the second electrode 34 to zero.

As shown in FIGS. 4-8, the CMOS image sensor 27 has a plurality of pinned photodiodes 31 with at least two electrodes 32 and 34 in between. Electrodes 32 operate at a different phase than electrodes 34 to allow charge 36 to move from underneath one electrode to the other. The phase relationship between electrodes 32 and electrodes 34 defines the transport direction of the charge 36. For example, control logic may be used to alternate the phase shift between the electrodes 34 and 34 such that the charge 36 moves from photodiode 31 adjacent to the second electrode 34, to underneath second electrode 34, to underneath first electrode 32, and finally to the photodiode 31 adjacent to the first electrode 32.

Figure 11:
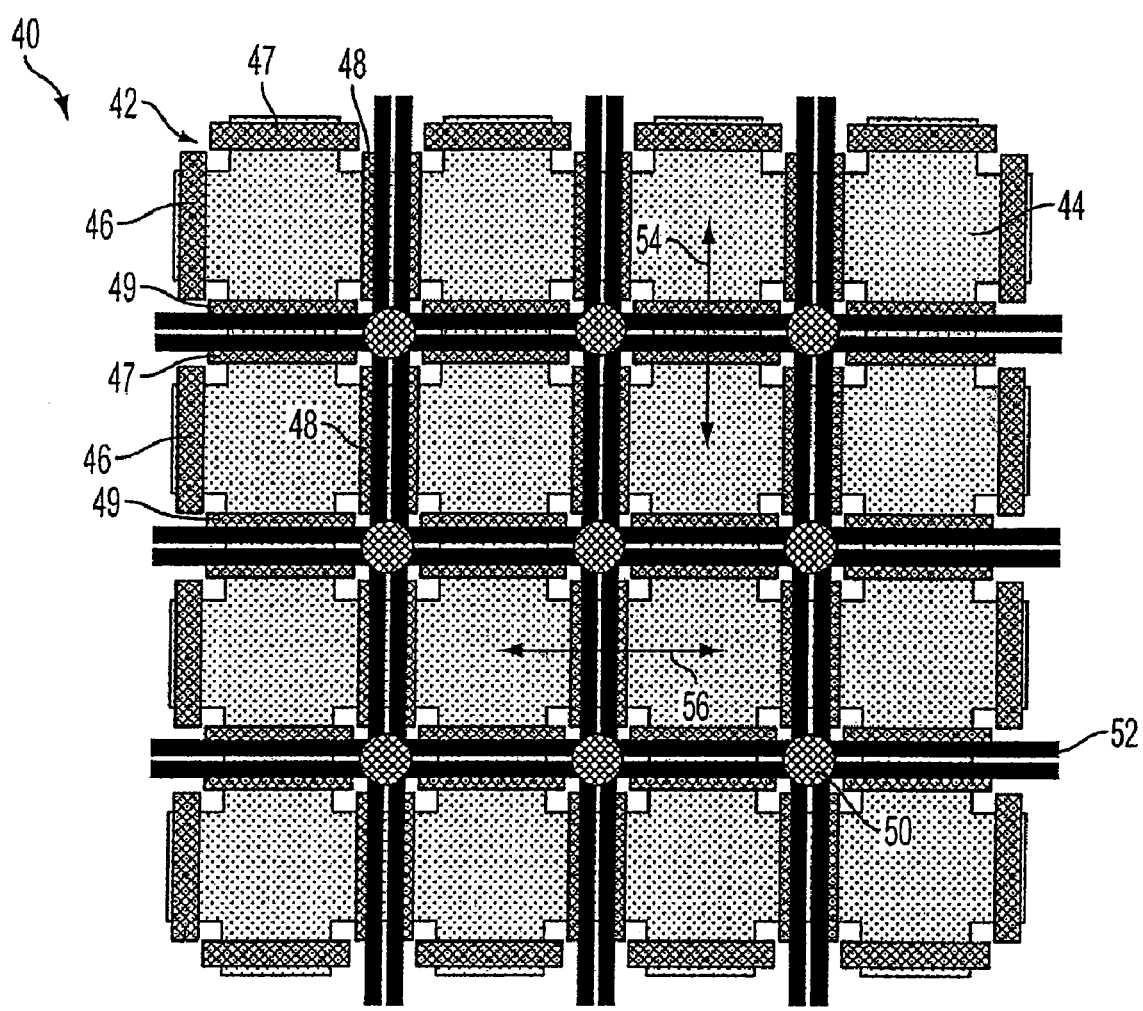
FIG. 11 is a two dimensional time delay integration visible CMOS image sensor, according to an embodiment of the invention.

FIG. 11 is a two dimensional time delay integration visible CMOS image sensor 40, according to an embodiment of the invention. The sensor 40 has an active array of pixels 42, each pixel 42 may include a pinned photodiode 44 with four orthogonal electrodes 46, 47, 48 and 49. The pixels 42 are interconnected in a grid with readout nodes 50 and address lines 52. The address lines 52 control the voltage on electrodes 46, 47, 48 and 49. Through an additional transfer gate (not shown) between photodiode 44 and readout node 50, the signal charge can be transferred to the readout node 50 at the end of a TDI cycle. In one embodiment, the sensor 40 has a readout node 50 for every photodiode 44.

With moving scene imagery, pinned photodiode 44 of the time delay integration visible CMOS image sensor 40 generates a charge that moves in two dimensions at about the same speed and follows a similar path as the moving image. Similarly, mechanical vibrations of a camera cause random walk of any image point on the sensor 40. FIG. 11 illustrates the two dimensional charge transport directions 54 and 56. The charge moves laterally from one photodiode 44 to another. This lateral movement of charge provides improved charge integration from the moving scene. Since there are multiple readout nodes 50 distributed evenly in the sensor 40, photo-generated signals may be read at any point in the array closest to the readout node 50, rather than transporting the charge for readout down or up stream. This provides high frame rate capability with improved signal to noise ratio for the sensor 40.

Figure 12:
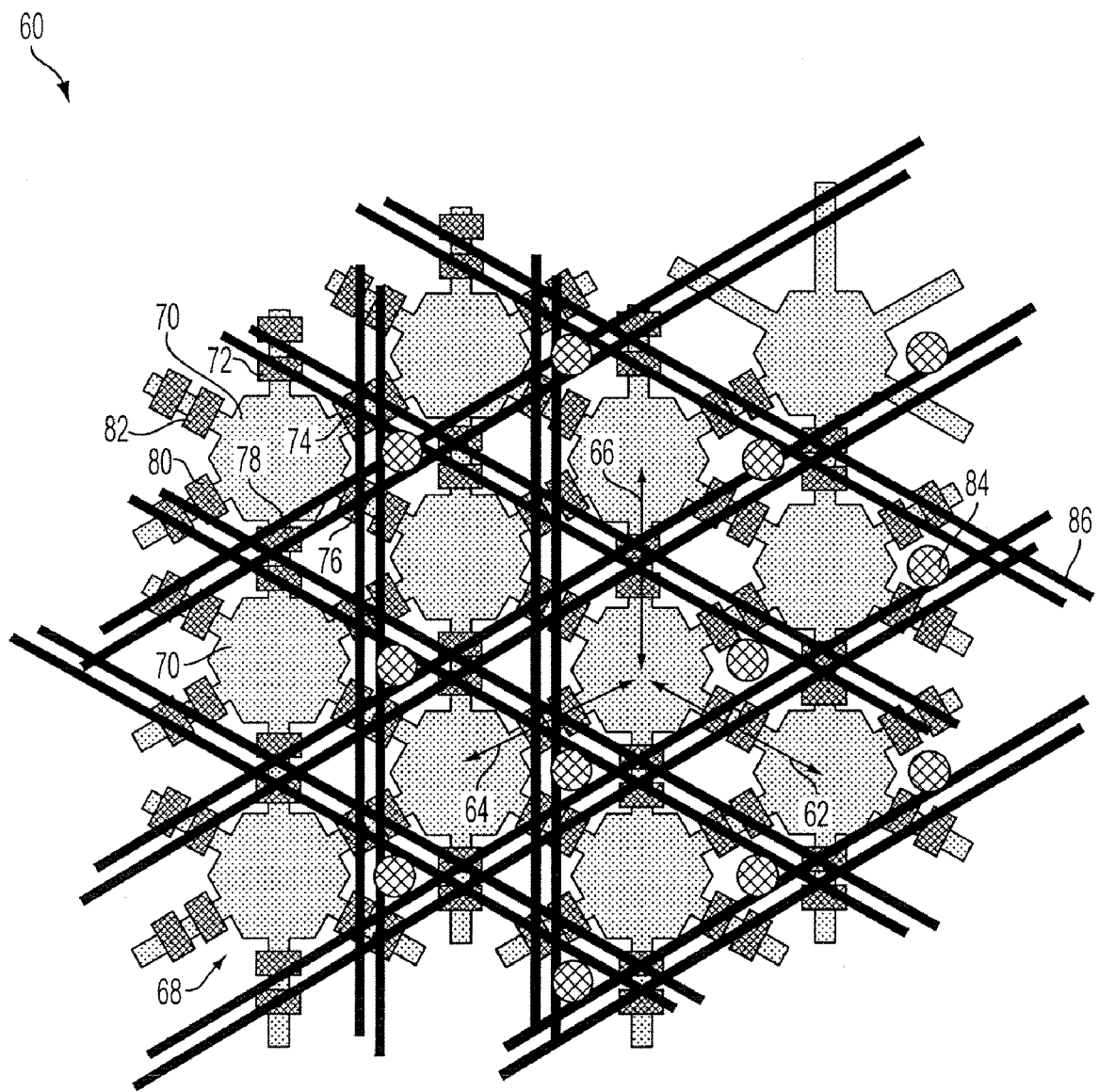
FIG. 12 is a two dimensional time delay integration visible CMOS image sensor, according to an embodiment of the invention.

To better approximate the curved random walk of a scene, the sensor may be configured to allow for charge transport in three or more directions. FIG. 12 illustrates charge transport in three directions 62, 64 and 66 for a two dimensional time delay integration visible CMOS image sensor 60, according to an embodiment of the invention. The sensor 60 has an active array of pixels 68, each pixel 68 may include a pinned photodiode 70 with six electrodes 72, 74, 76, 78, 80 and 82. The pixels 68 are interconnected in a polygonal grid, such as a hexagonal grid, with readout nodes 84 and address lines 86. The address lines 86 control the voltage on the electrodes 72, 74, 76, 78, 80 and 82. Through an additional transfer gate (not shown) between photodiode 70 and readout node 84, the signal charge can be transferred to the readout node 70 at the end of a TDI cycle. In one embodiment, the sensor 60 has a readout node 84 for every photodiode 70.

Figure 13:
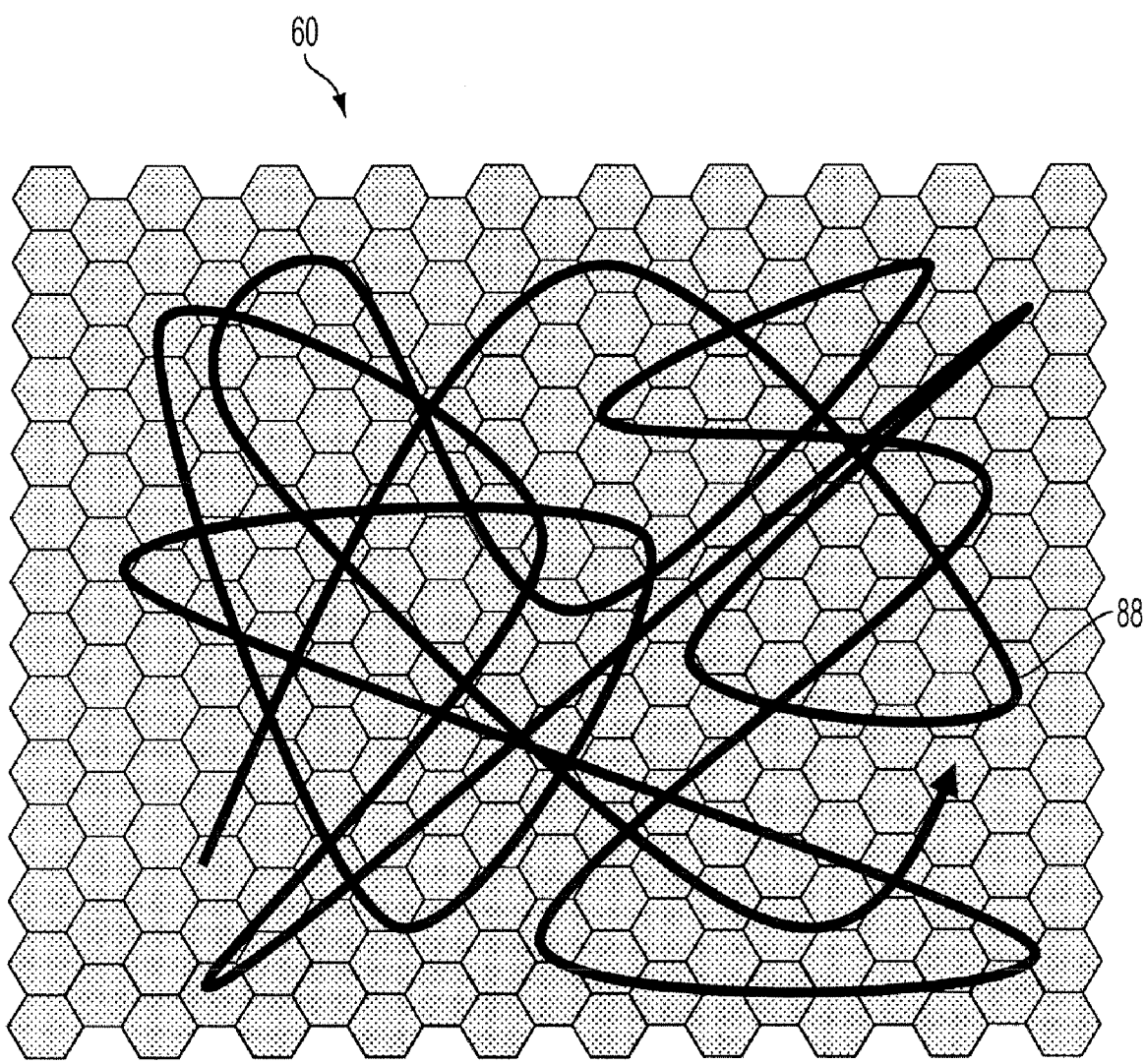
FIG. 13 illustrates lateral charge transport in a two dimensional time delay integration visible CMOS image sensor, according to an embodiment of the invention.

With moving scene imagery, pinned photodiode 70 of the time delay integration visible CMOS image sensor 60 generates a charge that moves in two dimensions at about the same speed and follows a similar path as the moving image. Similarly, mechanical vibrations of a camera cause random walk of any image point on the sensor 40. FIG. 13 illustrates lateral charge transport in sensor 60. Due to the hexagonal grid configuration, the charge travels in a smooth path 88 that follows the moving image. This lateral movement of charge provides improved charge integration from the moving scene. Since there are multiple readout nodes 84 distributed evenly in the sensor 60, photo-generated signals may be read at any point in the array closest to the readout node 84. This provides high frame rate capability with improved signal to noise ratio for the sensor 60.

A person skilled in the art would appreciate the potential applications of the two dimensional time delay integration visible CMOS image sensor of the present invention. The sensor may be used for translational image stabilization during single frame integration time. For example, very high bandwidth of translational vibrations can be stabilized from about 30 Hz to about 1 MHz. The maximum translational vibration amplitude may be limited by imager resolution. The sensor may also be used for rotational image stabilization during single frame integration time. For example, very high bandwidth of rotational movement can be stabilized from about 30 Hz to about 1 MHz. The maximum rotational vibration amplitude may be limited by pixel size and tolerable distortions.

Other applications of the sensor include residue light photography without tripod or flash, TDI camera with increased alignment tolerance and flow cytometry for capturing images of moving cells in fluids. The sensor may also be used, in combination with a stabilized gimbal, to enhance pointing accuracy to a few tens of grads. Additionally, the sensor may be used with Inertial Measurement Unit (IMU) to suppress random motion. Depending on frame rate, IMU may be replaced with processing algorithm.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other changes, combinations, omissions, modifications and substitutions, in addition to those set forth in the above paragraphs, are possible. Those skilled in the art will appreciate that various adaptations and modifications of the just described preferred embodiment can be configured without departing from the scope and spirit of the invention. Therefore, it is to be understood that, within the scope of the appended claims, the invention may be practiced other than as specifically described herein.

What is claimed is:

1. A two dimensional time delay integration CMOS image sensor comprising:
an array of pinned photodiodes including first and second pinned photodiodes, each pinned photodiode is configured to collect a charge when light strikes the pinned photodiode; and
a plurality of electrodes located around a perimeter of each pinned photodiode to form a grid, the plurality of electrodes including:
a first electrode located adjacent to the first pinned photodiode, and configured to create a first well for receiving the charge from the first pinned photodiode, and
a second electrode located adjacent to the first electrode and the second pinned photodiode, the second electrode configured to create a second well adjacent to the first well, cooperate with the first electrode for transferring the charge from the first well to the second well, and transfer the charge from the second well to the second pinned photodiode.

2. The two dimensional time delay integration CMOS image sensor of claim 1 further comprising a plurality of readout nodes coupled to the array of pinned photodiodes via address lines.

3. The two dimensional time delay integration CMOS image sensor of claim 1 further comprising a readout node for each pinned photodiode, the readout node is coupled to the array of pinned photodiodes via address line.

4. The two dimensional time delay integration CMOS image sensor of claim 1 wherein charge transport is bi-directional or tri-directional.

5. The two dimensional time delay integration CMOS image sensor of claim 1 wherein the grid is orthogonal or hexagonal.

6. The two dimensional time delay integration CMOS image sensor of claim 1 wherein the plurality of electrodes are activated consecutively at different cycles.

7. The two dimensional time delay integration CMOS image sensor of claim 1 wherein the charge transfer occurs over a four cycle period.

8. A two dimensional time delay integration CMOS image sensor comprising:
a plurality of pinned photodiodes including first and second pinned photodiodes, each pinned photodiode generates a charge when light strikes the pinned photodiode;
a plurality of electrodes separating the plurality of pinned photodiodes, the plurality of electrodes including:
a first electrode located adjacent to the first pinned photodiode, and configured to create a first well for receiving the charge from the first pinned photodiode, and
a second electrode located adjacent to the first electrode and the second pinned photodiode, the second electrode configured to create a second well adjacent to the first well, cooperate with the first electrode for transferring the charge from the first well to the second well, and transfer the charge from the second well to the second pinned photodiode; and
a plurality of readout nodes connected to the plurality of pinned photodiodes via address lines.

9. The two dimensional time delay integration CMOS image sensor of claim 8 wherein charge transport occurs in two or more directions.

10. The two dimensional time delay integration CMOS image sensor of claim 8 wherein the plurality of electrodes, the plurality of readout nodes and the address lines form a grid around the perimeter of each pinned photodiode.

11. The two dimensional time delay integration CMOS image sensor of claim 10 wherein the grid is orthogonal or hexagonal.

12. The two dimensional time delay integration CMOS image sensor of claim 8 wherein the plurality of electrodes are activated consecutively at different cycles.

13. The two dimensional time delay integration CMOS image sensor of claim 8 wherein the charge transfer occurs over a four cycle period.

14. The two dimensional time delay integration CMOS image sensor of claim 8 wherein the number of readout nodes is equal to the number of pinned photodiodes.

* * * * *